(12) United States Patent
Hirose et al.

(10) Patent No.: US 9,005,384 B2
(45) Date of Patent: Apr. 14, 2015

(54) METHOD FOR FORMING LAMINATE AND LAMINATING DEVICE

(71) Applicant: Kabushiki Kaisha Meiki Seisakusho, Ohbu-shi, Aichi (JP)

(72) Inventors: Tomoaki Hirose, Ohbu (JP); Takayuki Yamamoto, Tokoname (JP)

(73) Assignee: Kabushiki Kaisha Meiki Seisakusho, Ohbu-Shi (JP)

( * ) Notice: Subject to any disclaimer, the term of this patent is extended or adjusted under 35 U.S.C. 154(b) by 0 days.

(21) Appl. No.: 13/670,697

(22) Filed: Nov. 7, 2012

(65) Prior Publication Data

US 2013/0126074 A1   May 23, 2013

(30) Foreign Application Priority Data

Nov. 21, 2011 (JP) ................................. 2011-253800
Aug. 3, 2012 (JP) ................................. 2012-172714

(51) Int. Cl.
| | |
|---|---|
| B29C 65/00 | (2006.01) |
| B32B 37/00 | (2006.01) |
| B32B 37/14 | (2006.01) |
| B32B 37/10 | (2006.01) |

(52) U.S. Cl.
CPC ................. *B32B 37/14* (2013.01); *B32B 37/10* (2013.01); *B32B 37/1009* (2013.01); *B32B 2457/14* (2013.01)

(58) Field of Classification Search
USPC ........... 156/540, 541, 580, 581, 583.1, 583.3, 156/583.5, 228, 230, 247, 250, 252, 269, 156/270, 289, 285, 286, 323; 29/830, 832, 29/841; 100/211
See application file for complete search history.

(56) References Cited

U.S. PATENT DOCUMENTS

| | | | | |
|---|---|---|---|---|
| 5,286,329 | A * | 2/1994 | Iijima et al. ................... | 156/297 |
| 6,092,578 | A * | 7/2000 | Machida et al. ............... | 156/358 |
| 6,197,665 | B1 * | 3/2001 | DiStefano et al. ............ | 438/502 |
| 8,048,254 | B2 * | 11/2011 | Matsumura .................... | 156/289 |

(Continued)

FOREIGN PATENT DOCUMENTS

| | | |
|---|---|---|
| JP | A-08-332646 | 12/1996 |
| JP | A-9-307230 | 11/1997 |
| JP | A-11-004076 | 1/1999 |
| JP | A-2004-299147 | 10/2004 |
| JP | A-2007-331333 | 12/2007 |

(Continued)

OTHER PUBLICATIONS

Apr. 1, 2013 Notification of Grounds for Refusal issued in Korean Application No. 10-2012-0026498 with English-language translation.

*Primary Examiner* — John Goff
*Assistant Examiner* — Hannuri L Kwon
(74) *Attorney, Agent, or Firm* — Oliff PLC (57) ABSTRACT

A surface of a laminate base body including a projection is caused to penetrate at least a film-shaped laminating body and surely laminated by a simple configuration, and a laminate thereof is formed at a uniform thickness without an occurrence of voids. A laminating device is provided with a heating unit configured to heat at least an insulating resin film; an upper plate and a lower plate configured to be capable of opening and closing, and configured to form a chamber that becomes sealed upon closing; a receiving member having an elasticity and disposed on the upper plate; an elastic membrane body disposed on the lower plate; a vacuuming unit configured to vacuum inside of the chamber; and a compressing unit configured to bloat the elastic membrane body.

4 Claims, 4 Drawing Sheets

(56) References Cited

U.S. PATENT DOCUMENTS

2001/0003049 A1* 6/2001 Fukasawa et al. ............ 438/127
2009/0023250 A1* 1/2009 Speckels et al. ............. 438/118
2011/0186239 A1* 8/2011 Lai et al. .................... 156/583.1

FOREIGN PATENT DOCUMENTS

| JP | A-2009-032853 | 2/2009 |
| JP | A-2005-150273 | 6/2009 |
| KR | 10-2000-0076785 A | 12/2000 |

* cited by examiner

METHOD FOR FORMING LAMINATE AND LAMINATING DEVICE

BACKGROUND OF THE INVENTION

1. Field of the Invention

The present invention relates to a method for forming a laminate and a laminating device, and especially relates to a method for forming a laminate by layering a laminate base body including a projection, such as an electronic component including bumps, and a film-shaped laminating body, such as a resin, and heating and compressing the same so that the projection penetrates at least the film-shaped laminating body, and a device therefor.

2. Description of the Related Art

As a laminate base body such as an electronic component including a projection, for example, on a surface of a semiconductor wafer, bumps made of metal such as solder, copper, and gold is formed. These bumps project from the surface of the semiconductor wafer, typically are formed in a columnar shape with a tip resembling a sphere, or an egg shape, and have a height (projection amount) about 0.01 to 0.04 mm and a diameter about 0.01 to 0.04 mm. Further, an interval between adjacent bumps is 0.03 to 0.10 mm. In forming such bumps, a plating method, a paste printing method, a ball placement method and the like are employed.

The semiconductor wafer on which such bumps are to be formed typically is configured of silicon, is formed in a round shape, has standards of 4, 8, 12, 16 inches diameters, and has a thickness of 0.025 to 0.800 mm.

On the other hand, as the film-shaped laminating body, an insulating resin film is typically configured with thermosetting resin such as epoxy as chief ingredient. Further, the insulating resin film may in some cases be configured of thermoplastic resin, or a mixture of the thermosetting resin and the thermoplastic resin. Further, as shown in FIG. 3A, an insulating resin film F typically has protection films P1, P2 made, for example, of PET laminated on both surfaces, where one protection film P2 is delaminated upon forming a laminate with the semiconductor wafer W as shown in FIG. 3B, and the other protection film P1 is also delaminated after forming the laminate, for example upon mounting on a mount product as shown in FIG. 3C. A thickness of the insulating resin film F is for example about 0.01 to 0.06 mm. It is typically selected so that the tips of the bumps B are exposed from a surface of the insulating resin film F when the other protection film P1 is delaminated as shown in FIG. 3C, with the tips of the bumps B being penetrated therethrough.

Japanese Patent Application Laid-Open (JP-A) Nos. H11-4076, H9-307230, 2009-32853, and 2005-150273 are known, as prior art for laminating the laminate base body W including the projection B and the film-shaped laminating body F as described above. JP-A No. H11-4076 discloses layering a conductive foil on which a conductive bump is formed and an insulating resin layer, and heating and compressing the same between press plates of a planar press machine so that the conductive bump is caused to penetrate the insulating resin layer (0012, etc.). JP-A No. H11-4076 further discloses compressing and heating the conductive foil, the insulating resin layer, and a releasing sheet by passing the same between a pair of rolls so that the conductive bump penetrates the insulating resin layer (0064 etc.).

Further, JP-A No. H9-307230 discloses causing a conductive bump of a support base to oppose a composite resin sheet, and passing the same between rollers configured of a metal roller and a flexible rubber roller so as to primarily compress and cause the conductive bump to penetrate the composite resin sheet (0020 etc.).

Further, as another prior art, JP-A No. 2009-32853 discloses a pressing unit configured of an elastic member such as rubber and having a lower surface side with a shape of a curve with its center portion being positioned lower than its outer peripheral portion, or an inclined surface shape; and describes that, according to this shape, upon affixing an adhesive sheet S to a wafer W, the affixation can be performed while expelling air existing between the adhesive sheet S and the wafer W to outside (0017). Further, JP-A No. 2009-32853 describes that this pressing unit may be configured of a hollow elastic member, and may be configured such that the elastic member is bloated by compressed air or decompressed atmosphere so as to affix an adhesive sheet to a wafer (0036). Further, in JP-A No. 2009-32853, the semiconductor wafer and a ring frame are mounted on a supporting unit, the adhesive sheet is positioned above them, and the adhesive sheet is pressed against the semiconductor wafer and the ring frame by the adhesive sheet being sandwiched by the pressing unit.

As another prior art, JP-A No. 2005-150273 discloses performing a first laminate compressing process of laminating a composite resin sheet on a conductive supporting body and compressing the same in a state in which air between the conductive supporting body provided with a bump and the composite resin sheet is compulsorily sucked and discharged, so that a tip of the bump penetrates the composite resin sheet and is exposed therefrom, and a second laminate compressing process of laminating a conductive supporting body on the composite resin sheet and compressing the same, so that the tip of the bump exposed from the composite resin sheet is contact bonded to a conductive layer. Further, JP-A No. 2005-150273 discloses a compressing device including an upper plate capable of lowering and raising, a container chamber that is sealed airtight by this upper plate, and a pair of pressing members made of rubber that is disposed at a bottom portion of the container chamber (0019).

RELATED ART DOCUMENTS

Patent Document 1: JP-A H11-4076
Patent Document 2: JP-A H9-307230
Patent Document 3: JP-A 2009-32853
Patent Document 4: JP-A 2005-150273

SUMMARY OF INVENTION

In the above JP-A No. H11-4076, in the case of using the planar press machine, there have been problems such as not being able to form the film-shaped laminating body to be laminated on the laminate base body with a uniform thickness, the projection such as the bump being crushed by partially being compressed excessively, the film-shaped laminating body becoming thinner than a designed thickness, raising from a reason that a mechanical parallelism for maintaining both press plates parallel cannot be maintained accurately, or that a parallelism of compressing surfaces themselves of both of the press plates cannot be maintained accurately.

Figure 4:
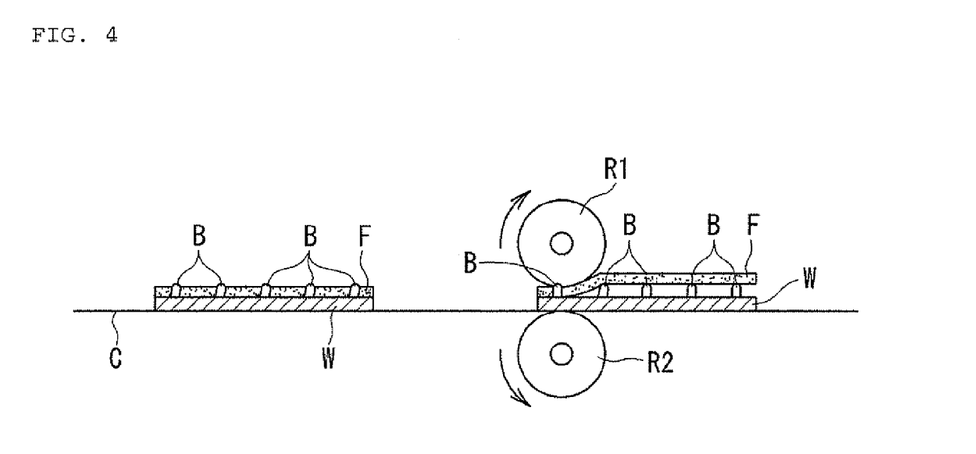
FIG. 4 is a cross-sectional view shown in order to describe prior art in a case of laminating the laminate base body and the film-shaped laminating body by compressing and heating between a pair of rollers.
Figure 5:
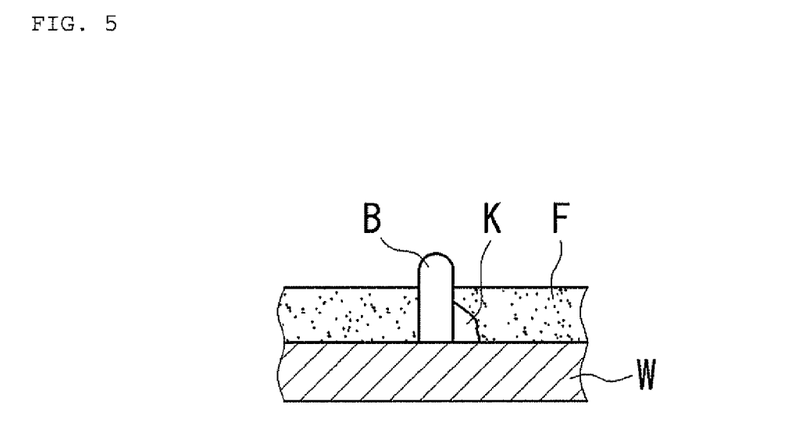
FIG. 5 is an enlarged cross-sectional view shown in order to describe a state in which a void has occurred in the film-shaped laminating body that is laminated with the laminate base body according to FIG. 4.

Further, as disclosed in JP-A Nos. H11-4076 and H9-307230, in the case of compressing and heating by the pair of rollers, since the laminate base body W and the film-shaped laminating body F are layered, and compressed and heated between rollers R1, R2 sequentially from a front side in a feeding direction (which is toward left in FIG. 4) as shown in FIG. 4, contacts of the rollers R1, R2 to the laminate base body W and the film-shaped laminating body F become linear contacts; and since the laminate base body W and the film-shaped laminating body F are sequentially compressed accompanying rotation of the rollers R1, R2, the laminate base body W and the film-shaped laminating body F cannot be compressed at their entireties over a certain period of time. Further, the tips of the projections B may deform so as to fall down toward a back side in the feeding direction (which is toward right in FIG. 4), and the projections B may be crushed. Moreover, in the case of compressing between the rolls R1, R2, portions of the laminate base body W and the film-shaped laminating body F to be compressed shift, whereby insufficient embedding of the film-shaped laminating body F may occur as shown in FIG. 5 due to short compressing time, as a result of which a void K is generated between the laminate base body W and the film-shaped laminating body F, especially in a periphery of the projection B. Further, in the case where the laminate base body W is formed in the round shape such as the semiconductor wafer, contact pressure does not stay constant but fluctuates, because lengths of the rollers R1, R2 making the linear contacts with the laminate base body W and the film-shaped laminating body F may differ depending on feeding positions of the laminate base body W and the film-shaped laminating body F with respect to the rollers R1, R2.

In JP-A No. 2009-32853, since the affixation is performed while expelling the air existing between the adhesive sheet and the wafer to outside merely by the shape of the lower surface of the pressing unit, the film-shaped laminating body cannot be laminated and embedded so that no air certainly exists between the laminate base body and the film-shaped laminating body and the projection of the laminate base body achieves the penetration. Further, in JP-A No. 2009-32853, since the semiconductor wafer and the ring frame are mounted on the supporting unit, the adhesive sheet is positioned above them, and the adhesive sheet is pressed against the semiconductor wafer and the ring frame by the adhesive sheet being sandwiched, a surface of the adhesive sheet does not become flat, and a thickness thereof does not become uniform. Due to this, JP-A No. 2009-32853 cannot be applied to laminating the film-shaped laminating body with a uniform thickness on the surface where the projection is formed of the laminate base body including the projection.

In JP-A No. 2005-150273, since a core substrate and a prepreg sheet are compressed between the upper plate and the bottom portion of the container chamber via the pair or rubber-made pressing members, the prepreg sheet cannot be laminated with a uniform thickness due to not being able to ensure a parallelism, similar to both of the press plates of the planar press machine of JP-A No. H11-4076. Further, in JP-A No. 2005-150273, although how the upper plate is made to lower is not clearly described, if the upper plate is to lower by discharging the air within the container chamber, since the compression of the core substrate and the prepreg sheet is started before sufficiently sucking the air between the core substrate and the prepreg sheet, the lamination of the composite resin sheet on the conductive supporting body and the compression of the same in the state in which the air between the conductive supporting body provided with the bump and the composite resin sheet is compulsorily sucked and discharged cannot be performed. Further, since the compression is performed by the rubber-made pressing member merely by vacuum suction, there may be cases in which a sufficient compression force cannot be ensured.

The present invention has been made in view of the above described problems, and objectives to provide a method and a device for causing a surface of a laminate base body including a projection to surely penetrate a film-shaped laminating body and be surely laminated by a simple configuration, and forming a laminate thereof at a uniform thickness without an occurrence of voids.

In order to achieve the above objectives, the invention of the method for forming a laminate of a first aspect is a method for forming a laminate by layering a laminate base body including a projection and a film-shaped laminating body, and heating and compressing the same so that the projection at least penetrates the film-shaped laminating body, the method including: layering the laminate base body and the film-shaped laminating body with each other by causing a side of the laminate base body on which the projection is formed to oppose the film-shaped laminating body; disposing the layered laminate base body and film-shaped laminating body between a receiving member having an elasticity and an elastic membrane body so that the film-shaped laminating body opposes the receiving member and the laminate base body opposes the elastic membrane body; and compressing the laminate base body and the film-shaped laminating body between the elastic membrane body and the receiving member by bloating the elastic membrane body in a state in which at least a space between the laminate base body and the film-shaped laminating body is vacuumed.

In order to achieve the above objectives, the invention of the method for forming a laminate of a second aspect disposes a member having a hardness that is harder than a hardness of the elastic membrane body as the receiving member in the invention described in the first aspect.

In order to achieve the above objectives, the invention of the method for forming a laminate of a third aspect layers the laminate base body and the film-shaped laminating body with each other by causing the film-shaped laminating body to oppose from above the side of the laminate base body on which the projection is formed, and compresses the laminate base body and the film-shaped laminating body by bloating the elastic membrane body from above the film-shaped laminating body in the invention described in the first aspect.

In order to achieve the above objectives, the invention of the method for forming a laminate of a fourth aspect mounts the laminate base body on a carrier film, and conveys the layered laminate base body and film-shaped laminating body between the receiving member and the elastic membrane body, and causes the elastic membrane body to compress the laminate base body and the film-shaped laminating body via the carrier film toward the receiving member in the invention described in any one of the first to third aspects.

Further, in order to achieve the above objectives, the invention of a laminating device of a fifth aspect is a laminating device configured to form a laminate by layering a laminate base body including a projection and a film-shaped laminating body, and heating and compressing the same so that the projection at least penetrates the film-shaped laminating body, the device including: a heating unit configured to heat at least the film-shaped laminating body; a pair of plates configured to be capable of opening and closing, and configured to form a chamber that becomes sealed upon closing; a receiving member having an elasticity, and disposed on one of the plates so as to oppose the film-shaped laminating body layered on one side of the laminate base body on which the projection is formed; an elastic membrane body disposed on the other of the plates so as to oppose the laminate base body on which the film-shaped laminating body is layered; a vacuuming unit configured to vacuum inside of the chamber; and a compressing unit configured to compress the laminate base body and the film-shaped laminating body between the elastic membrane body and the receiving member by bloating the elastic membrane body.

In order to achieve the above objectives, the invention of the laminating device of a sixth aspect disposes the elastic membrane body on an upper side plate of the pair of plates, and bloats the elastic membrane body so as to compress the laminate base body and the film-shaped laminating body between the elastic membrane body and the receiving member disposed on a lower plate in the invention described in the fifth aspect.

According to the method for forming a laminate of the first aspect, the side of the laminate base body on which the projection is formed and the film-shaped laminating body are made to oppose and be layered with each other, then are disposed between the receiving member having the elasticity and the elastic membrane body so that the film-shaped laminating body opposes the receiving member and the laminate base body opposes the elastic membrane body, at least the space between the laminate base body and the film-shaped laminating body is vacuumed for example by decompressing inside of a chamber provided to surround the above components, and in this state, compression is performed by pressing the laminate base body and the film-shaped laminating body against the receiving member by bloating the elastic membrane body. Due to the projection of the laminate base body being pressed by the elastic membrane body which thereby presses the film-shaped laminating body against the receiving member in the state in which at least the space between the laminate base body and the film-shaped laminating body is vacuumed, the film-shaped laminating body has the projection of the laminate base body penetrated therethrough, and is surely laminated with the laminate base body at a uniform thickness without an occurrence of voids.

According to the invention of the second aspect, in the invention described in the first aspect, by disposing the receiving member that is harder than the elastic membrane body to oppose the film-shaped laminating body that is layered with the laminate base body, the projection of the laminate base body is caused to penetrate at least the film-shaped laminating body upon compression by bloating the elastic membrane body, and the laminate of the film-shaped laminating body on the laminate base body with the uniform thickness and without the occurrence of voids can be implemented.

According to the invention of the method for forming a laminate of the third aspect, by layering the laminate base body and the film-shaped laminating body with each other by causing the film-shaped laminating body to oppose from above the side of the laminate base body on which the projection is formed, and by bloating the elastic membrane body from above the film-shaped laminating body, positional deviation of the laminate base body and the like upon the compression is prevented, and the laminate of the film-shaped laminating body and the laminate base body can be implemented.

According to the invention of the fourth aspect, in any of the inventions described in the first to third aspects, by mounting the laminate base body on a carrier film, it can easily be conveyed between the receiving member and the elastic membrane body together with the layered film-shaped laminating body; and further, since the carrier film is intervened upon performing the compression by pressing the laminate base body and the film-shaped laminating body by the elastic membrane body toward the receiving member, the film-shaped laminating body does not affix to the elastic membrane body. Note that, in a case of disposing a carrier film also on the film-shaped laminating body that is layered with the laminate base body, the film-shaped laminating body can also be prevented from of to the receiving member.

Further, according to the invention of the laminating device of the fifth aspect, the side of the laminate base body on which the projection is formed and the film-shaped laminating body are made to oppose and be layered with each other, then are disposed between the receiving member having the elasticity and the elastic membrane body so that the film-shaped laminating body opposes the receiving member disposed on one of the plates and the laminate base body opposes the elastic membrane body disposed on the other of the plates, the chamber sealed by relatively bringing both of the plates closed is formed, and inside of the chamber is vacuumed by the vacuuming unit. In this state, the laminate base body and the film-shaped laminating body are compressed by being pressed against the receiving member by bloating the elastic membrane body, and are heated by the heating unit. Since the projection of the laminate base body is pressed by the elastic membrane body in the vacuumed atmosphere, the film-shaped laminating body is pressed toward the receiving member, so the film-shaped laminating body has the projection of the laminate base body penetrated therethrough, and is surely laminated with the laminate base body with the uniform thickness without the occurrence of voids.

According to the invention of the laminating device of the sixth aspect, the elastic membrane body is disposed on an upper side plate of the pair of plates, and the elastic membrane body is bloated so as to compress the laminate base body and the film-shaped laminating body between the elastic membrane body and the receiving member disposed on a lower plate; thus, the occurrence of the positional deviation of the laminate base body and the like upon the compression is prevented, and the laminate of the film-shaped laminating body and the laminate base body can be implemented.

DETAILED DESCRIPTION OF PREFERRED EMBODIMENTS

Firstly, an embodiment of a laminating device of the present invention will be described in detail with reference to FIG. 1 and FIG. 2. Note that, in this embodiment, explanations will be given for a case in which a laminate base body including a projection is a semiconductor wafer W including bumps B (hereinafter, the projection is referred to as the bump, and the laminate base body is referred to as the semiconductor wafer), and a film-shaped laminating body is an insulating resin film (hereinafter, the film-shaped laminating body is referred to as the insulating resin film) F that at least has a protection film P1 disposed on a surface opposite from a surface that is to be laminated upon forming a laminate with the semiconductor wafer W as shown in FIG. 3.

Schematically, the laminating device of the present invention is for forming a laminate by layering the semiconductor wafer W including the bumps B and the insulating resin film F, and heating and compressing the same so that the bumps B penetrate at least the insulating resin film F, and includes: at least heating units 1, 2 configured to heat the insulating resin film F, an upper plate 3 and a lower plate 4 configured to be capable of opening and closing, and configured to form a sealed chamber 34 upon closing, a receiving member 5 having an elasticity and a surface that is a substantially flat surface, and disposed on the upper plate 3 so as to oppose the insulating resin film F layered on one side of the semiconductor wafer W on which the bumps B are formed, an elastic membrane body 6 disposed on the lower plate 4 so as to oppose the semiconductor wafer W on which the insulating resin film F is layered, a vacuuming unit 7 configured to vacuum inside of the chamber 34, and a compressing unit 8 configured to compress the semiconductor wafer W and the insulating resin film F between the elastic membrane body 6 and the receiving member 5 by bloating the elastic membrane body 6.

The upper plate 3 is plate-shaped, is formed such that a periphery of a lower surface opposing the lower plate 4 projects outward in a frame shape, and the receiving member 5 is disposed via a heat insulating material that is not shown and the heating unit 1 at inside of a portion 30 that projects in the frame shape. The heating unit 1 may be configured by disposing a cartridge heater within an upper heating plate configured of a flat-surfaced block made for example of steel, or by disposing a rubber heater on the surface of the upper heating plate. In the explanation below, the heating unit 1 will be referred to as the upper heating plate 1. The receiving member 5 has a larger area than the semiconductor wafer W and the insulating resin film F, is configured for example of a rubber material having heat resistivity such as silicon rubber or fluororubber, has a thickness of 0.5 to 4.0 mm (more preferably 1.0 to 4.0 mm), and has a hardness (measured according to JIS K-6253) of type A durometer hardness (shore A hardness) of 20 to 70 points (more preferably 45 to 60 points). The receiving member 5 is affixed to the flat surface of the upper heating plate 1. Note that, the receiving member 5 is not necessarily limited to being affixed in order to be disposed on the surface of the upper heating plate 1.

The lower plate 4 has a frame body 40 for retaining a rim portion of the elastic membrane body 6 by sandwiching the same attached on a periphery of an upper surface opposing the upper plate 1. Inside of the frame body 40 has a larger area than the semiconductor wafer W and the insulating resin film F, and on the upper surface of the lower plate 4 at the inside of the frame body 40, a heat insulating material that is not shown and the heating unit 2 are disposed so as to be covered by the elastic membrane body 6 retained by the frame body 40. A sealing member 41 such as an O-ring that seals air tightly by making contact with the frame-shaped portion 30 projecting at the periphery of the upper plate 3 upon closing the upper plate 3 and the lower plate 4 is disposed on the upper surface of the frame body 40. Similar to the upper plate 1, the heating unit 2 may be configured by disposing a cartridge heater within a lower heating plate configured of a flat-surfaced block made for example of steel, or by disposing a rubber heater on the surface of the lower heating plate. In the explanation below, the heating unit 2 will be referred to as the lower heating plate 2. Similar to the receiving member 5, the elastic membrane body 6 is configured for example of a rubber material having heat resistivity such as silicon rubber or fluororubber, has a thickness of 1.5 to 5.0 mm (more preferably 2.0 to 4.0 mm), and has a hardness (measured according to JIS K-6253) of type A durometer hardness (shore A hardness) of 10 to 40 points (more preferably 15 to 30 points). Note that, although the elastic membrane body 6 can be configured of a single layer of rubber layer having same hardness at its entirety, the present invention is not limited to this embodiment, but may set the hardness of only a center portion to be low (soft), while setting the hardness of a rim portion to be fixed by the frame body 40 to be high (hard), or alternatively may configure the entirety thereof with rubber with high hardness (for example, 40 to 60 points), and may be configured of multiple layers in which rubber with low hardness (for example, about 20 points) is affixed to an upper surface of the rubber with high hardness.

Note that fine concaves and convexes may be formed on the surfaces of the receiving member 5 and the elastic membrane body 6 in order to make air suction upon vacuuming inside of the chamber 34 and delaminating of carrier films C1, C2 after forming to be described later easier. Further, the receiving member 5 may have a stainless plate having a thickness for example about 0.5 to 2.0 mm and capable of elastically deforming affixed to its surface, and further may be configured to be capable of bloating outward similar to the elastic membrane body 6. Yet further, as will be described later, in this embodiment, in order to dispose the insulating resin film F on the semiconductor wafer W so as to form a laminate, the receiving member 5 is provided on the upper plate 3 and the elastic membrane body 6 is provided on the lower plate 4, however, no limitation is made to this embodiment, and the receiving member 5 may be provided on the lower plate 4 and the elastic membrane body 6 may be provided on the upper plate 1, as described later in FIG. 6.

Further, in this embodiment, a passage 31 is formed in the portion 30 that projects in the frame-shape of the outer periphery of the upper plate 3, and a conduit 70 that is the vacuuming unit 7 and connected to a vacuuming pump (not shown in Figure) is connected to this passage 31. Further, in this embodiment, passages 42, 22 are formed in the lower plate 4, the heat insulating material not shown, and the lower heating plate 2, and a conduit 80 that is the compressing unit 8 and connected to an air compressor and the like is connected to the passage 42 of the lower plate 4. Note that, in order to prevent the elastic membrane body 6 from accidentally bloating outward upon vacuuming inside of the chamber 34, a suction unit (not shown in Figure) such as a vacuuming pump may switchably be connected to the conduit 80 in addition to the compressing unit 8 such as the air compressor.

Further, in this embodiment, the upper plate 3 is fixed, the lower plate 4 is connected to a cylinder and the like, and the lower plate 4 is configured to be capable of raising and lowering so as to open and close relative to the upper plate 3. However, the lower plate 4 may be fixed and the upper plate 3 may be supported capable of raising and lowering so that the upper plate 3 opens and closes relative to the lower plate 4; or alternatively, both of the upper plate 3 and the lower plate 4 may be supported capable of raising and lowering so as to open and close relative to each other.

In this embodiment, a roll 10 for feeding out a carrier film C2 on which the semiconductor wafer W layered with the insulating resin film F is to be mounted and conveyed, and a roll 12 for winding up this carrier film C2 are disposed in the vicinity of the upper plate 3 and the lower plate 4, and further, a roll 9 for feeding out a carrier film C1 that is disposed to make contact with the insulating resin film F layered on the semiconductor wafer W and to convey the same by sandwiching it between the carrier film C1 and the underneath carrier film C2, and a roll 11 for winding up this carrier film C1 are disposed. Further, between respective ones of the feed-out rolls 9, 10, and the wind-up rolls 11, 12 in which pinch rollers 13, 14, 15, 16 for changing directions of the carrier films C1, C2 are respectively provided. The feed-out roll 10, the wind-up roll 12, and the pinch rollers 14, 16 for the lower carrier film C2 are positioned further apart from the upper plate 3 and the lower plate 4 than the feed-out roll 9, the wind-up roll 11, and the pinch rollers 13, 15 for the upper carrier film C1. Due to this, portions of the lower carrier film C2 where the carrier film C1 is not present above respectively configure a set stage (right side in FIG. 1) SS for mounting the semiconductor wafer W and layering the insulating resin film F, and a takeout stage (right side in FIG. 1) TS for taking out the laminate product of the semiconductor wafer W and the insulating resin film F. Each of the feed-out rolls 9, 10, the wind-up rolls 11, 12, and the pinch rollers 13, 14, 15, 16 is configured to be capable of providing suitable tension to the corresponding upper and lower carrier films C1, C2, and feeding out the same in a conveying direction in synchronization. In this embodiment, the upper and lower carrier films C1, C2 are made of polyethylene-telephtalate films by way of example, and ones with a thickness of 0.02 to 0.10 mm are used.

Next, an embodiment of a method for forming a laminate of the present invention will be described in detail together with the operation thereof by way of a case of using the laminating device configured as above-described and laminating the semiconductor wafer W including the bumps B as the laminate base body including the projection and a film in which the protection film P1 to be exfoliated after forming the laminate is affixed to the insulating resin film F that is the film-shaped laminating body.

Schematically, the laminating method for the present invention is for forming a laminate by layering the semiconductor wafer W including the bumps B and the insulating resin film F, and heating and compressing the same so that the bumps B penetrates at least the insulating resin film F; the semiconductor wafer W and the insulating resin film F are layered with each other by causing the side of the semiconductor wafer W on which the bumps B are formed to oppose the insulating resin film F, heating is started in the state in which the layered semiconductor wafer W and insulating resin film F are disposed between the receiving member 5 having the elasticity and the elastic membrane body 6 so that the insulating resin film F opposes the receiving member 5 and the semiconductor wafer W opposes the elastic membrane body 6, and the semiconductor wafer W and the insulating resin film F are compressed and heated between the elastic membrane body 6 and the receiving member 5 by bloating the elastic membrane body 6 in the state in which at least a space between the semiconductor wafer W and the insulating resin film F is vacuumed. Further, the method for forming a laminate of the present invention prepares the receiving member 5 having a hardness that is harder than at least a compressing surface of the elastic membrane body 6, and disposes the insulating resin film F layered on the semiconductor wafer W to oppose this receiving member 5. Further, the method for forming a laminate of the present invention mounts the semiconductor wafer W on the carrier film C2 (C1), conveys the layered insulating resin film F and semiconductor wafer W between the receiving member 5 and the elastic membrane body 6, and performs the compression via the carrier film C2 (C1) against the receiving member 5 by the elastic membrane body 6.

In laminating the insulating resin film F and the semiconductor wafer W, firstly, the surface on which the bumps B are formed of the semiconductor wafer W is made to face upward, the rectangular insulating resin film F that has a length of each edge larger than a diameter of the semiconductor wafer W is layered on this surface on which the bumps B are formed of the semiconductor wafer W, and they are mounted on the lower carrier film C2 of the set stage SS. At this occasion, in the case where the protection films P1, P2 are provided on both surfaces of the insulating resin film F as shown in FIG. 3A, the protection film P2 positioned on the lower side is exfoliated, and in this embodiment, after assuming a state in which the protection film P1 is affixed only on the upper side of the insulating resin film F, the insulating resin film F is layered on the semiconductor wafer W. Note that, the present invention is not limited to this embodiment, and the insulating resin film F may be layered on the semiconductor wafer W after assuming a state in which the semiconductor wafer W is mounted on the lower carrier film C2 on the set stage SS.

Figure 1:
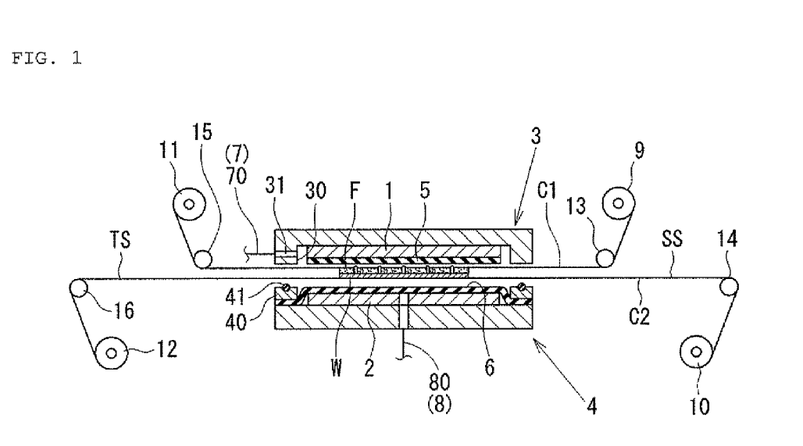
FIG. 1 is a cross-sectional view schematically shown in order to describe an embodiment of a laminating device of the present invention.

Then, as shown in FIG. 1, in the state where the upper plate 3 and the lower plate 4 are separated (opened state), both carrier films C1, C2 are fed out in synchronization to convey the layered semiconductor wafer W and insulating resin film F to between the receiving member 5 of the upper plate 3 and the elastic membrane body 6 of the lower plate 4, and subsequently cause the upper plate 3 and the lower plate 4 to approach to assume the closed state to form the sealed chamber 34. At this occasion, the upper heating plate 1 and the lower heating plate 2 are preferably heated to 50 to 120 degrees Celsius. Temperature detection for heating control may be performed by detecting temperatures of the upper heating plate 1 and the lower heating plate 2, or may alternatively be performed by detecting a temperature of the semiconductor wafer W and the like. At this occasion, both carrier films C1, C2 are intervened between the frame-shaped portion 30 of the periphery of the upper plate 3 and the sealing member 41 provided on the frame body 40 of the lower plate 4, and further, the layered semiconductor wafer w and insulating resin film F are contained within the sealed chamber 34. Further, the insulating resin film F opposes the receiving member 5 via the protection film P1 and the upper carrier film C1, and the semiconductor wafer W opposes the elastic membrane body 6 via the lower carrier film C2. After having been contained in the chamber 34 that has been heated to the predetermined temperature, the insulating resin film F layered on the semiconductor wafer W starts melting by heat conduction from the upper heating plate 1 and the lower heating plate 2 being started.

In this state, inside of the chamber 34 is vacuumed by the vacuuming unit 7 such as the vacuuming pump connected to the conduit 70 via the passage 31 shown in FIG. 1. Degree of vacuum inside of the chamber 34 at this occasion is preferably 0.1 to 10.0 hPa as an example, and more preferably 0.1 to 5.0 hPa. At this time, it is preferable to vacuum a space between the lower plate 4 and the elastic membrane body 6 via the conduit 80 connected to the passage 42 to cause the elastic membrane body 6 to be sucked onto the surface of the lower heating plate 2 so that the elastic membrane body 6 is prevented from accidentally bloating out in a state in which the vacuuming inside of the chamber 34 is insufficient, and maintain the upper and lower carrier films C1, C2, the elastic membrane body 6, and the receiving member 5 to be in non-contacting states. As a result of vacuuming inside of the chamber 34, air is sucked from between the surface of the semiconductor wafer W on which the bumps B are formed and the insulating resin film F, and a vacuumed state is assumed. Note that, at this occasion, the upper heating plate 1 and the lower heating plate 2 are heated to the predetermined temperature, and the receiving member 5 as well as the elastic membrane body 6 receive the heat therefrom, and inside of the chamber 34 is also heated. Accordingly, melting of the insulating resin film F progresses.

Figure 2:
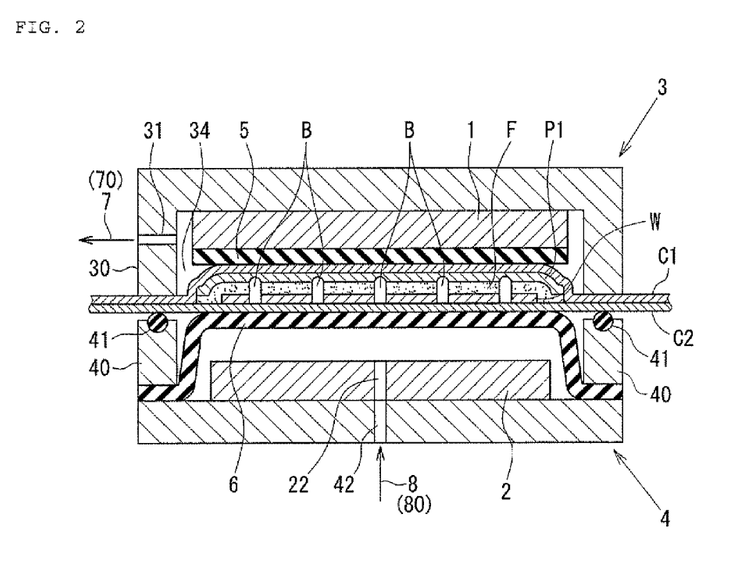
FIG. 2 is a partial enlarged cross-sectional view shown in order to describe a state in which a laminate base body and a film-shaped laminating body are laminated according to the present invention.
Figure 3:
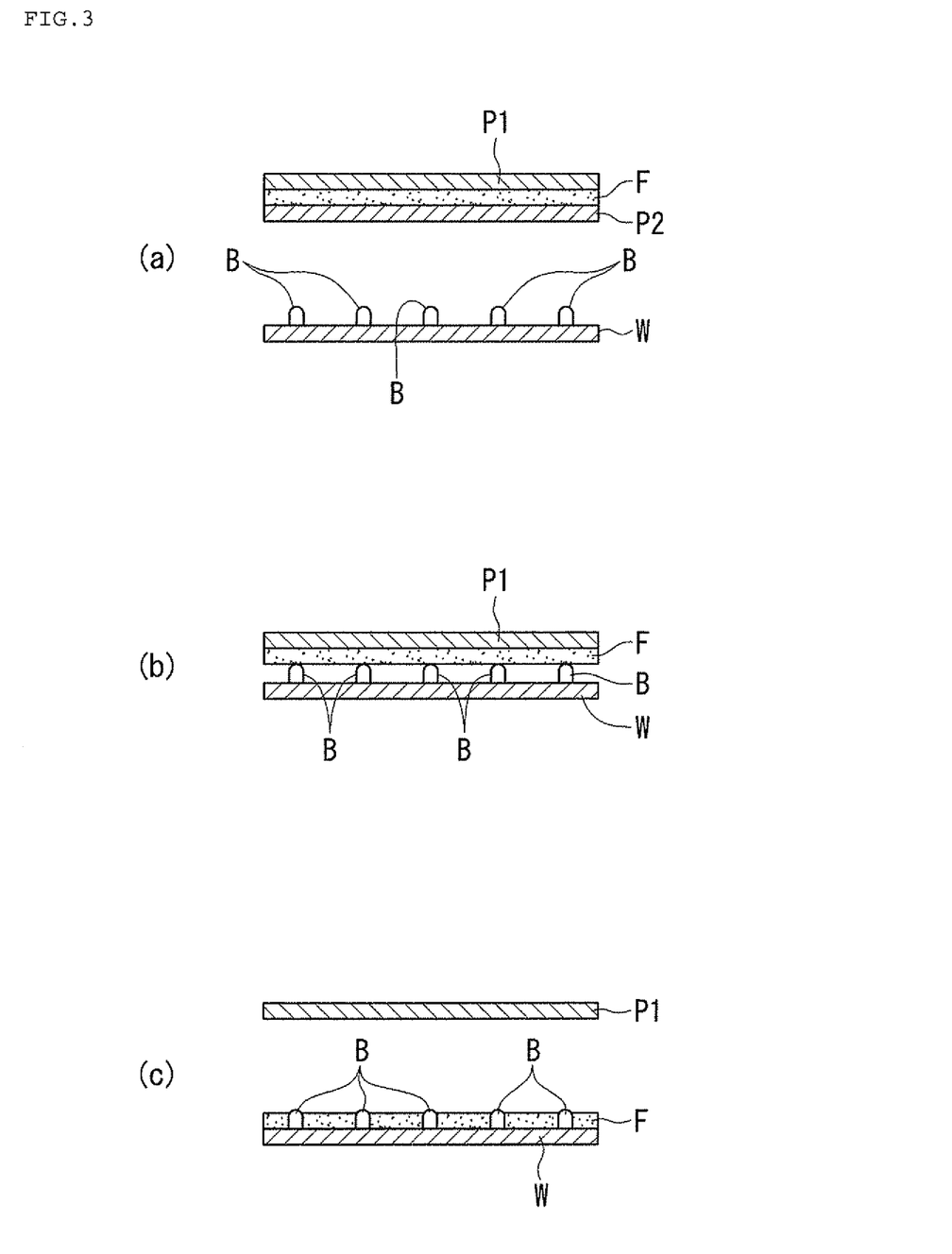
FIG. 3 is a cross-sectional view shown in order to describe a typical procedure for laminating the laminate base body and the film-shaped laminating body.

In this state, as shown in FIG. 2, the connection to the conduit 80 of the lower plate 4 is switched from the suction unit such as the vacuuming pump that is not shown to the compressing unit 8 such as the air compressor, compressed air is supplied to the space between the lower plate 4 and the elastic membrane body 6 via the passages 42, 22 connected to the conduit 80, and the elastic membrane body 6 is made to bloat outward. Note that, in the present invention, bloating out the elastic membrane body 6 is not limited to supplying the compressed air to the space between the lower plate 4 and the elastic membrane body 6, but the elastic membrane body 6 may also be bloated out with negative pressure for vacuuming inside of the chamber 34 by communicating the space between the lower plate 4 and the elastic membrane body 6 with the atmosphere. The compressing force (surface pressure) by the elastic membrane body 6 at this occasion is preferably 0.1 to 1.5 MPa as an example, and more preferably 0.5 to 0.9 MPa. Note that, the compressing force does not need to be constant from the start to the end of the compression, and may be varied during the compression by increasing or decreasing in accordance with needs.

The semiconductor wafer W is pressed via the lower carrier film C2 by the elastic membrane body 6 being bloated outward, and the insulating resin film F layered on the semiconductor wafer W is pressed against the receiving member 5 via the protection film P1 and the upper carrier film C1. That is, the layered semiconductor wafer W and insulating resin film F are respectively compressed between the elastic membrane body 6 and the receiving member 5 via the carrier films C1, C2, the insulating resin film F that is softened by heating by the heat via the elastic membrane body 6 and the receiving member 5 flows, the bumps B formed on the surface of the semiconductor wafer W are embedded by penetrating the insulating resin film F, and the laminate is formed thereby. The compression by the elastic membrane body 6 can be performed uniformly to respective regions of the semiconductor wafer W and the insulating resin film F; and no influence is imposed thereon even if a minor error resides in the parallelism of the upper plate 3 and the lower plate 4. Further, in a case of laminate forming the semiconductor wafer W having a large diameter one at a time, at an initial stage of compression by the elastic membrane body 6, since the elastic membrane body 6 bloats outward from a center portion and a region where the elastic membrane body 6 bloats outward expands toward a peripheral portion, a compressed portion expands from the center portion of the semiconductor wafer W and the insulating resin film F over the periphery thereof. As a result, even if air bubbles remain between the semiconductor wafer W and the insulating resin film F, a force to expel them toward an outer direction works, and the air bubbles and the like are unlikely to be formed.

At this occasion, since tips of the bumps B formed on the surface of the semiconductor wafer W enter into the receiving member 5 having the elasticity or cause the receiving member 5 to elastically deform so as to make the receiving member 5 dented, the bumps b are not crushed, and the surface of this receiving member 5 that does not make contact with the bumps B comes to form the surface of the insulating resin film F (layer). At this occasion, the tips of the bumps B penetrate the insulating resin film F as shown in FIG. 2, however, a case in which they do not penetrate the protection film P1 and a case in which they penetrate both F and P1 are expected. Further, since the hardness of the receiving member 5 is set higher (harder) than the hardness of the elastic membrane body 6, the surface of the insulating resin film F (layer) is formed flat, and the insulating resin film F (layer) is formed with a uniform thickness. Further, since inside of the chamber 34 is vacuumed, and the entire surface of the semiconductor wafer W and the insulating resin film F are sufficiently compressed between the receiving member 5 and the elastic membrane body 6 over a predetermined time in a direction along which the bumps B projects, the deformation of the bumps B to be tilted as in the prior art shown in FIG. 4 and the void K being generated in the insulating resin film F as shown in FIG. 5 do not occur. Note that, as for the compressing time, 20 to 200 seconds is preferable as an example.

Further, since the semiconductor wafer W and the insulating resin film F are compressed between the receiving member 5 and the elastic membrane body 6 via the upper and lower carrier films C1, C2, the insulating resin film F (layer) that is in a flowable state by being softened by heating is prevented from being flown out to its surroundings, affixing and contaminating the receiving member 5 and the elastic membrane body 6.

When the insulating resin film F is laminated on the semiconductor wafer W, the upper plate 3 and the lower plate 4 are opened by being relatively separated, both carrier films C1, C2 are fed out in synchronization to convey the laminate product configured by the laminate of the semiconductor wafer W and the insulating resin film F from between the receiving member 5 of the upper plate 3 and the elastic membrane body 6 of the lower plate 4, and is conveyed to the takeout stage TS. At this occasion, the insulating resin film F and the semiconductor wafer W that are layered to be laminated next may simultaneously be conveyed between the receiving member 5 of the upper plate 3 and the elastic membrane body 6 of the lower plate 4. Then, at the takeout stage TS, or in a subsequent process, excessive portions of the insulating resin film F laminated on the semiconductor wafer W are cut off. Further, the protection film P1 is delaminated thereafter, and finally the layer of the insulating resin film F is laminated and lamination molding is completed.

Figure 6:
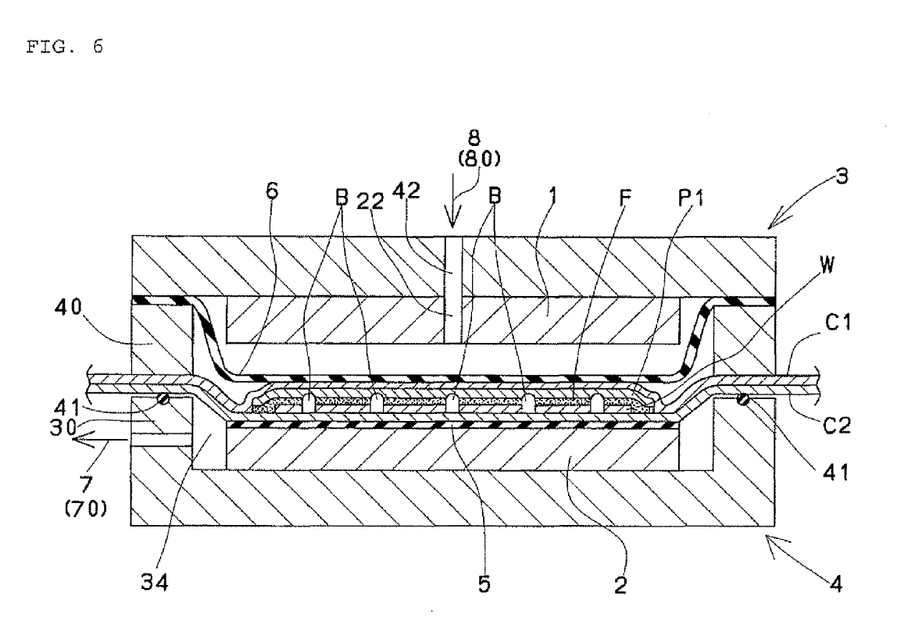
FIG. 6 is a partial enlarged cross-sectional view shown in order to describe a state in which the laminate base body and the film-shaped laminating body are laminated according to another embodiment of the present invention.

Further, the present invention may be a laminating device of another embodiment as shown in FIG. 6. Note that, in the laminating device shown in FIG. 6, members having the same functions as those of the laminating device shown in FIG. 1 are indicated by the same reference signs. The laminating device of FIG. 6 has the elastic membrane body 6 that bloats outward by being compressed disposed on the upper plate 3 side opposing the lower plate 4. Further, the receiving member 5 made of elastic rubber is disposed on a heating plate that is the heating unit 2 of the lower plate 4. That is, in the laminating device shown in FIG. 6, the plates to which the elastic membrane body 6 and the receiving member 5 are to be attached are inversed on upper and lower sides, and other functions are substantially the same. Further, in a comparison of the hardness of the rubber of the elastic membrane body 6 and the hardness of the rubber of the receiving member 5, it is preferable to make the hardness of at least the compressing surface of the elastic membrane body 6 higher (harder).

A method for forming a laminate by the laminating device of the other embodiment shown in FIG. 6 has the insulating resin film F layered on the surface of the semiconductor wafer W where the bumps B are projecting, and they are conveyed into the chamber 34 of the laminating device. Then, a space between the upper plate 3 and the lower plate 4 is closed to form the sealed chamber 34, and inside of the chamber 34 is vacuum-sucked. Further, next, the compressed air is supplied to a back surface side of the elastic membrane body 6 on the upper plate 3 side so as to bloat the elastic membrane body 6 outward, and the compression of the semiconductor wafer W is performed from the insulating resin film F side. By forming as above, since the elastic membrane body 6 is not bloated outward from the lower plate 4 side as in the example of FIG. 1, there is an advantage that the semiconductor wafer W is unlikely to be positionally deviated. Further, the semiconductor wafer W to be laminate formed is preferably mounted with the bumps B on the upper surface side, however, there may be cases in which the compression is better performed from the bump B side via the insulating resin film F. Note that, the elastic membrane body 6 may have the same or lower hardness of rubber relative to the receiving member 5.

The present invention is not limited to the above described embodiments, and maybe applied to a wiring board with through-silicon via (TSV), a micro-electro-mechanical systems wafer (MEMS wafer) and the like as the laminate base body including the projection. Note that, depending on materials of the semiconductor wafer W and the insulating resin film F, deviations from conditions described in the above embodiments (temperatures, pressure, forming time, and the like) are also expected. Further, upon laminating the insulating resin film F on the semiconductor wafer W, it is typical for the bumps B to penetrate the insulating resin film F, however, this laminating device may be used for those that does not penetrate but are embedded. Further, as the film-shaped laminating body, it may be applied to cases of laminating layers other than the insulating resin film F such as a photo resist layer. Further, the insulating resin film F may employ a continuous system similar to the upper and lower carrier films C1, C2.

What is claimed is:

1. A method for forming a laminate by layering a laminate base body including a projection and a film-shaped laminating body, and heating and compressing the same so that the projection of the laminate base body completely penetrates at least the film-shaped laminating body, the method comprising:
    layering the laminate base body and the film-shaped laminating body with each other by causing a side of the laminate base body on which the projection is formed to oppose the film-shaped laminating body;
    disposing the layered laminate base body and film-shaped laminating body between a receiving member having an elasticity and an elastic membrane body so that the film-shaped laminating body opposes the receiving member and the laminate base body opposes the elastic membrane body; and
    compressing the laminate base body and the film-shaped laminating body between the elastic membrane body and the receiving member by bloating the elastic membrane body in a state in which at least a space between the laminate base body and the film-shaped laminating body is vacuumed,
wherein:
    the receiving member is made of a rubber material having heat resistivity;
    the elastic membrane body is made of a rubber material having heat resistivity and is made to bloat outward by compressed air; and
    a rubber member having a hardness that is harder than a hardness of the elastic membrane body is disposed on the surface of the receiving member.

2. A method for forming a laminate by layering a laminate base body including a projection and a film-shaped laminating body, and heating and compressing the same so that the projection of the laminate base body completely penetrates at least the film-shaped laminating body, the method comprising:
    layering the laminate base body and the film-shaped laminating body with each other by causing a side of the laminate base body on which the projection is formed to oppose the film-shaped laminating body;
    disposing the layered laminate base body and film-shaped laminating body between a receiving member having an elasticity and an elastic membrane body so that the laminate base body opposes the receiving member and the film-shaped laminating body opposes the elastic membrane body; and
    compressing the laminate base body and the film-shaped laminating body between the elastic membrane body and the receiving member by bloating the elastic membrane body in a state in which at least a space between the laminate base body and the film-shaped laminating body is vacuumed,
wherein:
    the receiving member is made of a rubber material having heat resistivity;
    the elastic membrane body is made of a rubber material having heat resistivity and is made to bloat outward by compressed air; and
    a rubber member having a hardness that is harder than a hardness of the elastic membrane body is disposed on the surface of the receiving member.

3. The method for forming a laminate according to claim 1, wherein:
    the laminate base body is mounted on a carrier film,
    the layered laminate base body and film-shaped laminating body are conveyed between the receiving member and the elastic membrane body, and
    the elastic membrane body compresses the laminate base body and the film-shaped laminating body via the carrier film toward the receiving member.

4. The method for forming a laminate according to claim 2, wherein:
    the laminate base body is mounted on a carrier film,
    the layered laminate base body and film-shaped laminating body are conveyed between the receiving member and the elastic membrane body, and
    the elastic membrane body compresses the laminate base body and the film-shaped laminating body via the carrier film toward the receiving member.

* * * * *